United States Patent
Yoon et al.

(10) Patent No.: US 10,246,795 B2
(45) Date of Patent: Apr. 2, 2019

(54) TRANSFER-FREE METHOD FOR FORMING GRAPHENE LAYER

(71) Applicant: WITHUSTECH CO., LTD., Daejeon (KR)

(72) Inventors: Soon-Gil Yoon, Daejeon (KR); Byeong-Ju Park, Daejeon (KR)

(73) Assignee: Kuk-Il Graphene Co., Ltd., Gangnam-gu (KR)

(*) Notice: Subject to any disclaimer, the term of this patent is extended or adjusted under 35 U.S.C. 154(b) by 0 days.

(21) Appl. No.: 15/272,717

(22) Filed: Sep. 22, 2016

(65) Prior Publication Data

US 2017/0081782 A1    Mar. 23, 2017

(30) Foreign Application Priority Data

Sep. 22, 2015  (KR) .................. 10-2015-0134006
Aug. 18, 2016  (KR) .................. 10-2016-0105001

(51) Int. Cl.
  *C30B 25/18*    (2006.01)
  *C23C 16/26*    (2006.01)
  (Continued)

(52) U.S. Cl.
  CPC ........ *C30B 25/186* (2013.01); *C03C 17/3634* (2013.01); *C03C 17/3649* (2013.01); *C23C 14/185* (2013.01); *C23C 14/205* (2013.01); *C23C 14/34* (2013.01); *C23C 16/0281* (2013.01); *C23C 16/26* (2013.01); *C23C 16/46* (2013.01); *C23C 16/52* (2013.01);
  (Continued)

(58) Field of Classification Search
  CPC combination set(s) only.
  See application file for complete search history.

(56) References Cited

U.S. PATENT DOCUMENTS

2012/0288227 A1* 11/2012 Kim .................. G01N 21/7703
                                                        385/12
2013/0187097 A1*  7/2013 Hong ..................... C23C 16/26
                                                        252/510

FOREIGN PATENT DOCUMENTS

KR    10-2012-0071213 A      7/2012
KR    10-2014-0129875 A     11/2014
KR        10-1475460 B1     12/2014

OTHER PUBLICATIONS

Addou, R. et al., "Monolayer graphene growth on Ni(111) by low temperature chemical vapor deposition", Applied Physics Letters, 100, (2012) pp. 021601-1-021601-3.
(Continued)

*Primary Examiner* — Erin F Bergner
(74) *Attorney, Agent, or Firm* — Mintz Levin Cohn Ferris Glovsky and Popeo, P.C.; Kongsik Kim; Joohee Lee

(57) ABSTRACT

The present invention relates to a transfer-free method for forming a graphene layer, in which a high-quality graphene layer having excellent crystallinity can be easily formed over a large area at low temperature by a transfer-free process so that it can be applied directly to a base substrate, which is used in a transparent electrode, a semiconductor device or the like, without requiring a separate transfer process, and to an electrical device comprising a graphene layer formed by the method. More specifically, the transfer-free method for forming a graphene layer comprises the steps of: depositing a Ti layer having a thickness of 3-20 m on a base substrate by sputtering; and growing graphene on the deposited Ti layer by chemical vapor deposition.

7 Claims, 11 Drawing Sheets

(51) Int. Cl.
    *C23C 16/02*     (2006.01)
    *C23C 16/46*     (2006.01)
    *C23C 16/52*     (2006.01)
    *C23C 14/34*     (2006.01)
    *C23C 14/18*     (2006.01)
    *C23C 14/20*     (2006.01)
    *C03C 17/36*     (2006.01)
    *H01L 21/285*     (2006.01)
    *C30B 25/16*     (2006.01)
    *C30B 29/02*     (2006.01)

(52) U.S. Cl.
    CPC ............ *C30B 25/165* (2013.01); *C30B 29/02* (2013.01); *H01L 21/28506* (2013.01)

(56) References Cited

OTHER PUBLICATIONS

Blöchl, P.E., "Projector augmented-wave method", Physical Review B, vol. 50, No. 24 (Dec. 15, 1994) pp. 17 953-17 957.
Kresse, G. and Furthmüller, J., "Efficient iterative schemes for ab initio total-energy calculations using a plane-wave basis set", Physical Review B, vol. 54, No. 16 (Oct. 15, 1996) pp. 11 169-11 186.
Perdew, J.P. et al., "Generalized Gradient Approximation Made Simple", Physical Review Letters, vol. 77, No. 18 (Oct. 28, 1996) pp. 3865-3868.

\* cited by examiner $E_{bind}$
-8.22 eV/C atom

$E_{bind}$
-8.16 eV/C atom $E_{bind}$
-7.92 eV/C atom $E_{bind}$
-5.35 eV/C atom

TRANSFER-FREE METHOD FOR FORMING GRAPHENE LAYER

CROSS-REFERENCE TO RELATED APPLICATION

This application claims priority to Korean Application No. 10-2015-0134006 filed Sep. 22, 2015 and Korean Patent Application No. 10-2016-0105001 filed Aug. 18, 2016 which applications are incorporated herein by references.

TECHNICAL FIELD

The present invention relates to a transfer-free method for forming a graphene layer, in which a high-quality graphene layer having excellent crystallinity can be easily formed over a large area at low temperature by a transfer-free process so that it can be applied directly to a base substrate, which is used in a transparent electrode, a semiconductor device or the like, without requiring a separate transfer process, and to an electrical device comprising a graphene layer formed by the method.

BACKGROUND ART

Graphene is a two-dimensional hexagonal sheet of $sp^2$-bonded carbon atoms and has a physical strength which is at least 200 times higher than that of steel. Graphene has a thermal conductivity which is about 10 times higher than that of a metal such as copper or aluminum, and it has very high electron mobility, and thus has resistance which is at least 35% lower than that of copper at room temperature. In addition, it shows an anomalous hall effect at temperatures higher than room temperature. Thus, graphene has been reported to have interesting physical and electrical properties. Due to such properties, in recent years, studies on the preparation of high-quality graphene and on the application of graphene to devices have been actively conducted.

Graphene can generally be prepared by four methods: a mechanical exfoliation method, a chemical method employing a reducing agent, an epitaxial method employing a silicon carbide insulator, and a chemical vapor deposition (CVD) method.

A typical preparation method, first introduced in the world, is a method in which graphene is prepared from highly ordered pyrolytic graphite (HOPG) by a very delicate mechanical exfoliation technique. The mechanical exfoliation method played a crucial role in rapidly diffusing graphene research, due to simple sample preparation. However, the size of graphene prepared by the mechanical exfoliation method is only on the order of micrometers, and thus there are many limits to the actual application of the mechanical exfoliation method.

For this reason, for the preparation of large-area graphene, a method has been studied which comprises: chemically exfoliating highly ordered pyrolytic graphite (HOPG) in a liquid state by use of a strong acid to form a graphene oxide film; transferring the formed graphene oxide film onto a base substrate; and reducing the transferred graphene oxide film into graphene by a chemical reduction method. However, there is a disadvantage in that crystalline defects that can deteriorate the electrical properties of graphene can occur during the oxidation and reduction of graphene.

The epitaxial method is a method in which carbon, adsorbed on or included in crystals, grows into graphene along the surface texture of the crystals. For example, epitaxial graphene can be prepared on a SiC (0001) substrate by heat treatment in a vacuum. According to this method, a graphene film having a size similar to that of a wafer can be fabricated, but there is a problem in that the base substrate is limited to an expensive SiC (0001) substrate.

In recent years, a technique has been developed in which graphene is prepared on a catalytic metal such as nickel or copper by chemical vapor deposition with methane gas. According to the chemical vapor deposition method, it is possible to control the number of graphene layers by controlling the kind and thickness of catalyst, the reaction time, the concentration of reactive gas, etc. In addition, graphene prepared by this method have the best properties, and can be produced in large amounts.

However, when a graphene layer is formed by chemical vapor deposition, a nickel or copper catalyst layer formed for deposition of the graphene layer changes the electrical and optical properties of a base substrate on which the graphene layer is formed, and thus it also adversely affects the properties of a transparent electrode or semiconductor device comprising the graphene layer. In addition, because vapor deposition of graphene is performed at a temperature as high as about 1000° C. in order to crystallize graphene, deformation of the base substrate during the deposition process can occur when the base substrate has low heat resistance. For this reason, in order for a graphene layer formed by chemical vapor deposition to be actually used for an electrode or a device, a process of transferring a graphene layer, grown on a catalytic metal, onto a base substrate, is necessarily required.

A graphene transfer method which is generally used comprises: forming a graphene layer on a catalytic metal; removing the catalytic metal by etching using PDMS (polydimethylsiloxane) or PMMA (polymethylmethacylate) as a support layer; transferring the graphene layer onto a base substrate; and then removing the support layer. However, there is a problem in that, due to mechanical deformation (wrinkle, ripple, etc.) of graphene in the transfer process, many defects are formed at the interface between the transferred graphene layer and the base substrate, and for this reason, the behavioral characteristics of a device comprising a heterojunction of the graphene layer and the base substrate are deteriorated.

In order to overcome the problem occurring in the method of forming a graphene layer by chemical vapor deposition, various methods for increasing the success rate of transfer have been developed. The present inventors previously found that when graphene is transferred onto a Ti thin film, mechanical deformation of the graphene can be can be minimized, and thus the excellent electrical properties of the graphene can be maintained. This finding is disclosed in Korean Patent No. 10-1475460.

However, a more fundamental solution to the problem is to develop a method for forming a graphene layer, which needs no transfer process.

For this, introduction of a metal layer required to form a graphene layer by chemical vapor deposition should not affect the electrical and optical properties of a base substrate. However, a study thereon has not yet been reported.

Even though the metal layer does not affect the electrical and optical properties of the base substrate, low-temperature vapor deposition should be possible in order to form a graphene layer directly on a flexible substrate which has recently attracted attention as a base substrate for a semiconductor device. Rafik Addou et al.(Applied Physics Letters 100, 021601, 2012) reported that the use of nickel as a catalyst enables a graphene layer to be formed by chemical vapor deposition even at a low temperature of about 550° C., and also reported that carbide formed on the surface of the nickel layer inhibits the growth of graphene at a temperature below 500° C. Polyimides are being most widely used for base substrates for flexible devices, and have a glass transition temperature of about 300° C. Among these polyimides, Kapton polyimide is thermally stable at a temperature of up to about 400° C., and thus can be applied even in a relatively high temperature process. However, the temperature of the process for forming a graphene layer is still high such that chemical vapor deposition cannot be applied to a polyimide-based synthetic resin that is used for a base substrate, and the polyimide-based synthetic resin is also costly. It is strongly required to develop a base substrate having high heat resistance and to lower the process temperature so that the process can be applied even to polyethylene (PE), polyethylene terephthalate (PET), polycarbonate (PC), polyether sulfone (PES) and the like, which are inexpensive, but the application of which to base substrates is limited due to their low heat resistance.

SUMMARY

Accordingly, the present invention has been made in order to solve the problems occurring in the prior art, and it is an object of the present invention to provide a method in which a high-quality graphene layer having excellent crystallinity can be formed directly on a base substrate over a large area without requiring a separate transfer process, by using a pretreatment process which can promote the growth of graphene without changing the electrical and optical properties of the base substrate.

Another object of the present invention is to a method in which a graphene layer having excellent crystallinity can be formed even at a temperature of 400° C. or lower, preferably lower than 300° C.

Still another object of the present invention is to provide an electrical device comprising a graphene layer formed by the above-described method.

To achieve the above objects, the present invention provides a transfer-free method for forming a graphene layer, comprising the steps of: depositing a Ti layer having a thickness of 3-20 nm on a base substrate by sputtering; and growing graphene on the deposited Ti layer by chemical vapor deposition.

As used herein, the term "base substrate" refers to a substrate, such as a transparent electrode or a semiconductor device, on which a graphene layer is to be formed and used. In a conventional method for forming a graphene layer, which comprises a transfer process, the base substrate corresponds to a substrate onto which a graphene layer is finally transferred. In the present invention, a graphene layer is grown directly on a substrate on which the graphene layer is to be finally formed, and thus a transfer process is not required. The base substrate that is used in the present invention is not limited in terms of its material or shape, and may be a single-layer substrate or a substrate having other materials deposited thereon. Although the material of the base substrate is not limited, the base substrate is preferably made of glass, a metal oxide, $SiO_2$, or a synthetic polymer, such as PET (polyethylene terephthalate), PES (polyether sulfone), PC (polycarbonate) or polyimide, which contains oxygen in the structure thereof, because Ti forms a strong bond with the base substrate by a chemical bond between Ti and the oxygen atom. However, the base substrate does not need to contain an oxygen atom, because the major characteristic of the present invention is that graphene can be grown by chemical vapor deposition without changing the properties of the base substrate, by forming a Ti layer having 3-20 nm on the base substrate.

As disclosed in Korean Patent No. 10-1475460 registered in the name of the present inventors, Ti chemically bonds with the oxygen of a substrate to form a strong bond with the substrate, while it forms Ti oxide even by physical vapor deposition (PVD). The present inventors expected that graphene transferred onto a substrate will form a strong bond with the substrate, because mechanically exfoliated graphene forms a strong bond with the substrate by the bonding between oxygen present in the graphene and Ti. The present inventors also confirmed this expectation as disclosed in Korean Patent No. 10-1475460. Furthermore, the present inventors have theoretically predicted that graphene can be grown directly on a base substrate, which was surface-modified with Ti, by chemical vapor deposition without having to use a catalytic metal such as nickel or copper, so that a transfer process that causes mechanical defects can be omitted. The present inventors have confirmed this prediction by experiments.

In an example of the present invention, the transmittances of glass substrates having deposited thereon Ti layers having varying thicknesses were measured using a UV-Vis spectrophotometer, and as a result, it was shown that when the thickness of the Ti layer was 20 nm or less, the transmittance of the glass substrate was substantially equal to the transmittance of bare glass, and that the transmittance of the glass substrate decreased rapidly as the thickness of the Ti layer increased (data not shown). In addition, it could be seen that the sheet resistance of Ti(20 nm)/glass was about $2.3 \times 10^9$ $\Omega/\square$, which is almost similar to the sheet resistance of bare glass ($2.4 \times 10^9$ $\Omega/\square$), indicating that the Ti layer having a thickness of 20 nm or less does not substantially affect the electrical conductivity of the substrate. Thus, when the thickness of the Ti layer deposited on the base substrate was 3-20 nm, only the surface properties of the base substrate could be modified without substantially affecting the electrical and optical properties (such as transmittance and electrical conductivity) of the base substrate itself. In addition, when the base substrate is made of a transparent flexible material such as PET, the transparency and flexibility of the base substrate can be maintained even after graphene is deposited thereon, and thus the range of application of the base substrate can further be expanded.

The temperature of the substrate in the process of growing graphene by chemical vapor deposition may be 150 to 900° C. If other reaction conditions are not changed, the crystallinity of graphene increases as the temperature increases, and thus even a temperature of 900° C. or higher does not become a problem. However, as the temperature increases, the cost required for formation of a graphene layer increases. For this reason, the temperature is preferably 900° C. or lower.

Particularly, according to the present invention, a graphene layer having excellent crystallinity can be formed even when the temperature of the substrate in the process of growing graphene by chemical vapor deposition is as low as 150 to 400° C. According to a conventional technology, even when a catalyst layer formed of a metal such as nickel or copper is used, graphene can not be deposited by chemical vapor deposition at a temperature of 400° C. However, this invention enables the graphene deposition at a temperature below 400° C. Thus, when Kapton polyimide known to be thermally stable at a temperature of up to about 400° C. is used as a base substrate, a graphene layer can be formed directly on the substrate by the method of the present invention without requiring a transfer process. Furthermore, according to the method of the present invention, a high-quality graphene layer can be formed even at a temperature between 150° C. and lower than 300° C. Among flexible substrates, Kapton polyimide is widely used due to its relatively high heat resistance, but is costly. Polymer resins, such as polyethylene, polyethylene terephthalate, polycarbonate, or polyether sulfone, are inexpensive, but are deformed due to their low heat resistance in a process of fabricating flexible substrates, and for this reason, the use of such polymers has been limited. However, the present invention makes it possible to form a graphene layer even at a temperature as low as 150° C., and the Raman spectrum of the formed graphene layer indicated that the graphene has excellent properties. In order to form a high-quality graphene layer at a temperature between 150° C. and 400° C., the working pressure in the process of growing graphene by chemical vapor deposition is preferably 10 mTorr or lower.

The crystallinity of a graphene layer being formed can further be controlled by controlling the working pressure and the composition and flow rate of a reactive gas.

A reactive gas that is used for the growth of graphene may comprise, as a carbon source, one or more selected from the group consisting of methane, ethane, propane, acetylene, methanol, ethanol and propanol. In addition, inert gas such as argon or helium may be supplied as an atmosphere gas together with the reactive gas during the growth of graphene. However, in order to increase the concentration of the carbon source while preventing the process pressure from increasing, only the carbon source can be used without using a separate atmosphere gas. In addition, to prevent an oxidation reaction from occurring during the growth of graphene, a mixture of hydrogen gas and carbon gas is more preferably used as the reactive gas.

It was reported that graphene produced by chemical vapor deposition contains bonds such as C=O or C—OH. It is expected that oxygen from the graphene will form a bond with Ti to thereby contribute to stabilization of the deposited graphene. If the Ti layer formed on the base substrate bonds with the oxygen of the air to form titanium oxide, graphene cannot be stabilized. For this reason, the method of the present invention preferably further comprises, before deposition of the graphene, a step of removing an oxide layer on the Ti layer by a reduction reaction. Removal of the oxide layer may be achieved by treating the Ti layer with hydrogen gas in a heated state, but is not limited thereto. In an example of the present invention, it could be seen that when the Ti layer was treated with hydrogen gas, the area of growth of graphene increased and the crystalline properties of graphene were improved.

According to the method of the present invention, a Ti layer is deposited on a base substrate without changing the transparency and electrical conductivity of the base substrate, and then graphene is grown on the substrate, and for this reason, no transfer process is required. Thus, there are no concerns about the occurrence of mechanical defects in the transfer process. In addition, when a graphene pattern is to be formed on the substrate, the pattern can be easily formed by forming a mask during deposition of titanium (Ti) or graphene without requiring an additional process such as etching.

The present invention is also directed to an electrical device comprising a substrate fabricated by the above-described method, wherein the substrate comprises: a base substrate; a 3-20 nm-thick Ti layer deposited on the base substrate by sputtering; and a graphene layer deposited on the Ti layer by chemical vapor deposition. The substrate is fabricated by growing graphene directly on the base substrate by chemical vapor deposition, and thus has minimized mechanical defects and also has excellent electrical properties and shows more stable electrical properties.

It is to be understood that the electrical device may be any device comprising a conventional graphene junction device. Namely, the electrical device may be any component comprising a graphene electrode, and examples thereof include, but not limited to, capacitors, displays, organic field-effect transistors, solar cells, LEDs, etc.

DETAILED DESCRIPTION

Hereinafter, the present invention will be described in further detail with reference to examples. It is to be understood, however, that these examples are for illustrative purposes only and are not intended to limit or change the scope of the present invention. In addition, those skilled in the art will appreciate that various modifications and alterations are possible based on this illustration, without departing from the scope and spirit of the invention.

EXAMPLES

Example 1

Density Functional Theory-based Simulation of Graphene Growth on Ti Surface

The growth of graphene on a Ti (0001) crystal surface by the adsorption and surface diffusion of carbon was simulated based on the density functional theory (DFT).

More specifically, the first-principle method based on the density functional theory, which is implemented in a VASP (Vienna Ab-initio Simulation Package) provided with projector-augmented-wave method (PAW) method [Phys. Rev. B 50, 1795317979 (1994)], was used [Phys. Rev. B 54, 1116911186 (1996)]. The exchange-correlation energy functional theory was represented by the generalized gradient approximation (GGA) in the PBE (Perdew-Burke-Ernzerhof) method [Phys. Rev. Lett. 77, 38653868 (1996)], and the kinetic energy cutoff was set at 400 eV. Electron density functional theory calculation for the junction of graphene and Ti was performed using 72 carbon atoms and three titanium layers arranged in a Ti (0001) direction with a 5×5 size, and calculation for determining the effect of oxygen was performed by adsorbing 37 oxygen atoms stepwise onto titanium to oxidize the titanium.

1) Simulation of Adsorption Positions of Carbon Atoms on Titanium Surface

Figure 1:
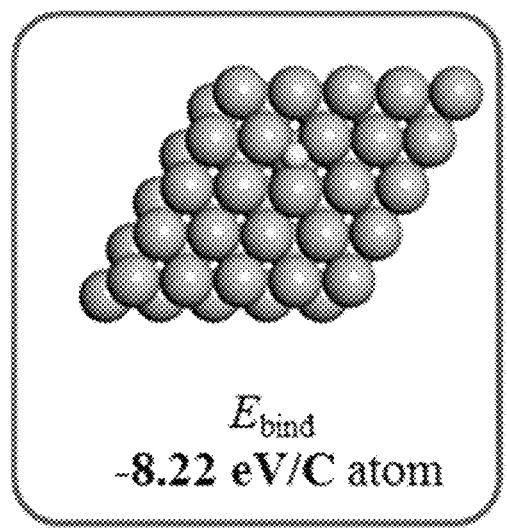
FIG. 1 shows the results of simulating the adsorption position of carbon on a titanium surface.
Figure 1:
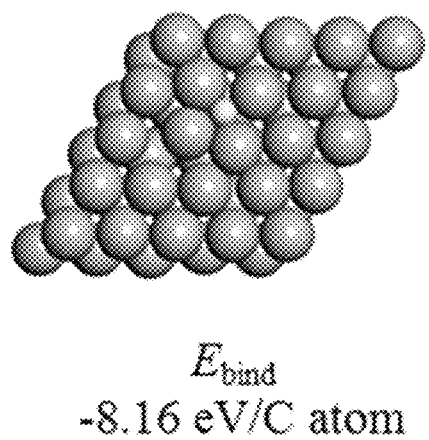
Figure 1:
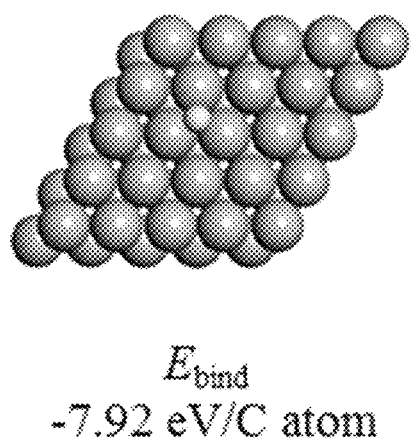
Figure 1:
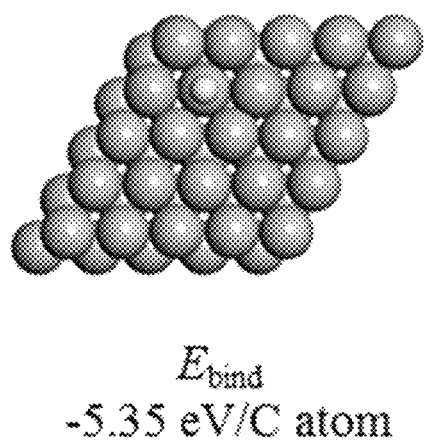

First, the binding energy ($E_{bind}$) of carbon atoms adsorbed on a titanium surface was simulated at each adsorption position, and the results of the simulation are shown in FIG. 1. In FIGS. 1-4, the ash color(larger sphere) represents titanium atoms, and the yellow color(smaller sphere) represents carbon atoms. The binding energy is represented by the difference between the bottom-state energy of carbon atoms adsorbed on the titanium surface and the sum of the bottom-state energies of the titanium surface and the carbon atoms. As can be seen in FIG. 1, the binding energy at the FCC point at which the lower titanium layer is present while three titanium atoms are gathered in a triangular form is −8.22 eV/C atom, indicating that the FCC point is the most preferable point for adsorption of carbon atoms. This suggests that carbon atoms can be located at the titanium FCC point when graphene is produced on the titanium surface, and that Ti—C atoms are morphologically well matched.

Figure 2:
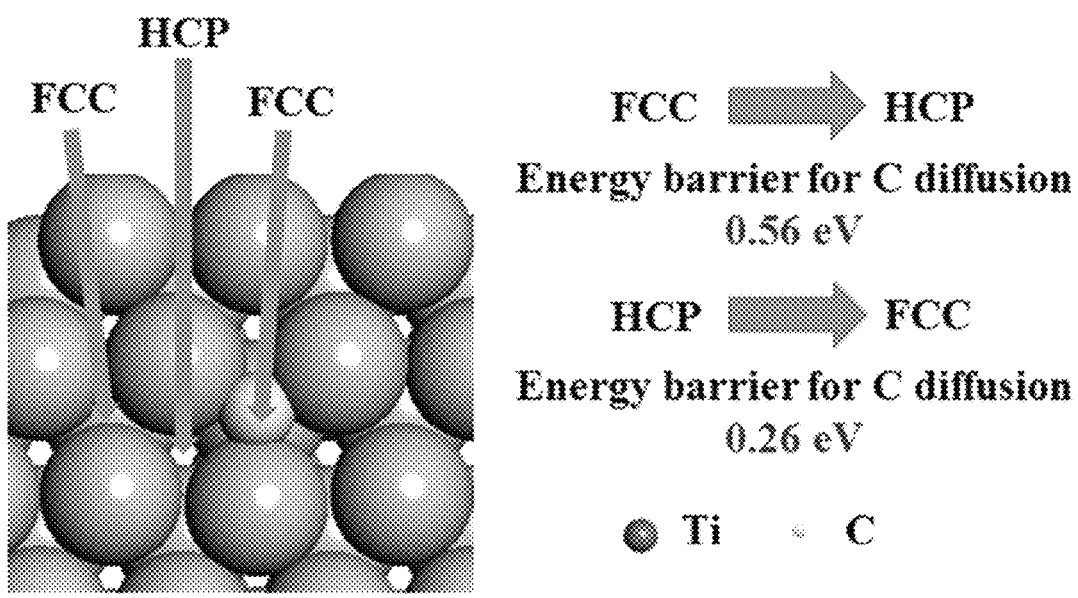
FIG. 2 shows the results of simulating activation energy required for surface diffusion of carbon on a titanium surface.

2) Simulation of Graphene Growth on Titanium Surface by Surface Diffusion of Carbon The surface diffusion of carbon on the titanium surface was simulated by DFT calculation. FIG. 2 shows the results of calculating activation energy required for the surface diffusion of carbon on the titanium surface, and indicates that activation energy between 0.26 eV and 0.56 eV is required depending on the position to which carbon is diffused. Table 1 below shows the results of simulating the surface diffusion rates of carbon at varying vapor deposition temperatures when carbon is diffused with activation energy of 0.56 eV. Table 1 shows that the surface diffusion rate of carbon at 300K is $3.91 \times 10^2$/sec, indicating that carbon can be diffused to the titanium surface even at low temperatures when the amount of carbon is sufficient.

TABLE 1

| Temperature | 300K | 400K | 500K |
|---|---|---|---|
| Diffusion rate (times/sec) | $3.91 \times 10^2$ | $8.80 \times 10^4$ | $2.27 \times 10^6$ |
| Movement distance (/sec) | 132 nm | 29.7 μm | 767 μm |
| Movement distance (/hour) | 475.2 μm | 106.9 μm | 2761.2 mm |

Figure 3:
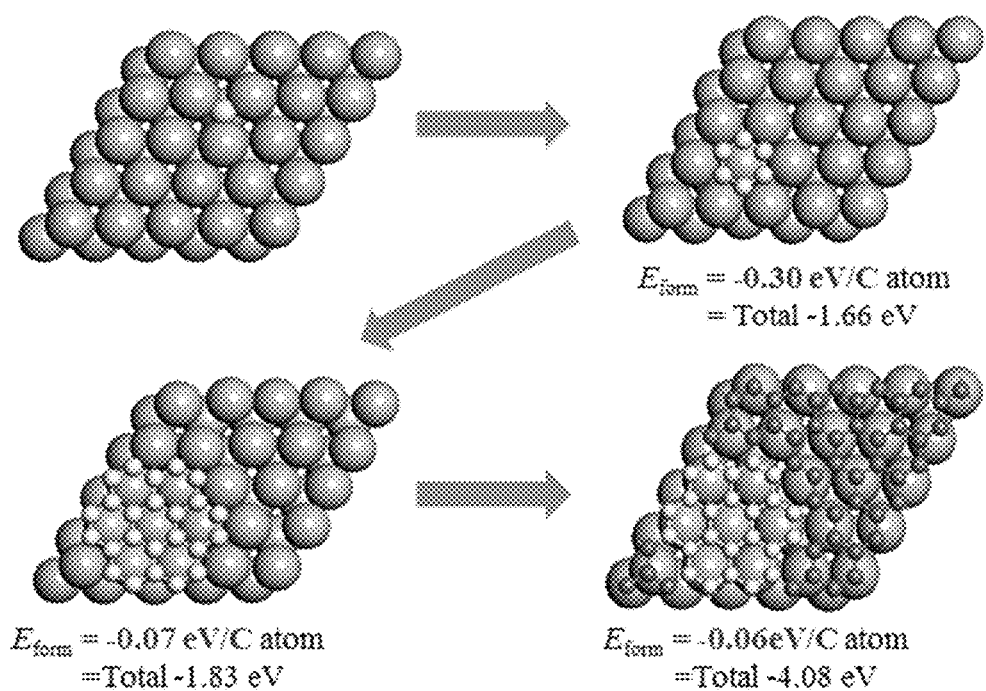
FIG. 3 shows the results of simulating thermodynamics of C6 ring formation and graphene layer formation.
Figure 4:
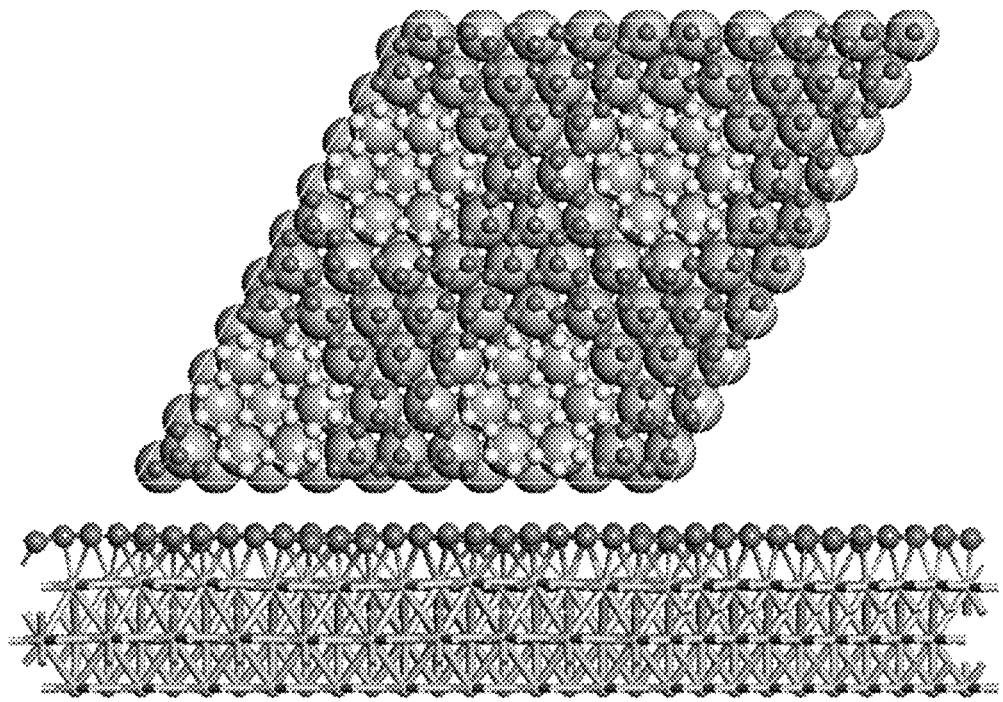
FIG. 4 shows the results of simulating graphene grown on a Ti (0001) substrate by perfect Ti—C lattice matching.

FIG. 3 shows the results of simulating thermodynamics of C6 ring formation and graphene layer formation by DFT calculation. Assuming that a sufficient amount of carbon is present and a sufficient amount of time is given for diffusion, carbon atoms are adsorbed onto the FCC point of the titanium layer, and then form a C6 ring by surface diffusion. The formation energy ($E_{form}$) of the C6 ring is a total of −1.66 eV, indicating that the C6 ring is in a stable state. Then, the C6 ring acts as a nucleus for growth, and the formation energy gradually decreases as graphene grows, suggesting that growth to large-area graphene is possible through continuous supply and diffusion of carbon. FIG. 4 shows simulation results indicating that when a sufficient amount of Carbon and a sufficient amount of time are given, graphene is grown on a Ti (0001) substrate by perfect Ti-C lattice matching.

Example 2

Growth of Graphene Layer on Titanium Layer

1) Deposition of Ti by Sputtering

Ti was deposited on a base substrate by sputtering to modify the surface of the substrate. Specifically, a $SiO_2$(250 nm)/Si substrate or a 100 μm-thick PET (polyethylene terephthalate) substrate as a base substrate was washed, and $N_2$ gas was used to remove foreign matter from the surface. Then, using a 2 inch-diameter Ti metal target (purity: 99.99%), Ti was deposited at room temperature by a DC sputtering method. Herein, the working pressure was maintained at 0.13 Pa, and 20 sccm (standard cc/min) of Ar gas was used as the sputtering gas. In addition, a DC power of 20 W was applied to the Ti target, and a Ti layer having a thickness of 10 nm was deposited at a rate of 1.5 nm/min.

Figure 5:
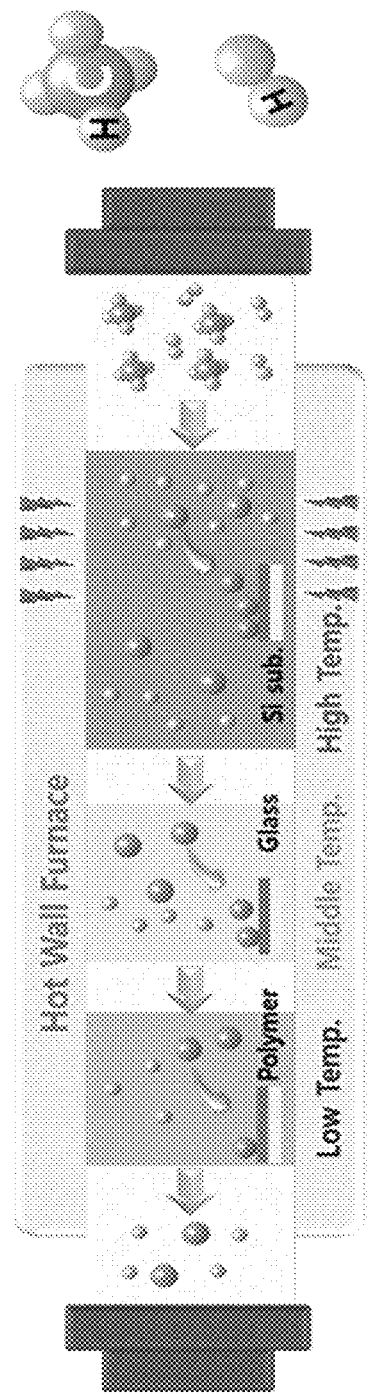
FIG. 5 is a schematic view of a 3-zone furnace used in chemical vapor deposition in an example of the present invention.

2) Evaluation of Characteristics of Graphene at Varying Graphene Growth Temperatures Using a 3-zone furnace shown in FIG. 5, a graphene layer was formed on the Ti(10 nm)/$SiO_2$(250 nm)/Si substrate, prepared in $^1$), by rapid thermal chemical vapor deposition (T-CVD). Because the 3-zone furnace has a heating device at the inside side through which a reactive gas is introduced, C atoms are produced by thermal decomposition of the reactive gas. Because only the inlet of the furnace is heated, the temperature of the furnace decreases as it moves away from the inlet, and thus the reaction temperature can be controlled depending on the position of the substrate. For example, a substrate having high heat resistance, such as a Si or glass substrate, may be located in a high-temperature or middle-temperature zone, and a flexible polymer substrate having low thermal stability may be located in a low-temperature zone, thereby controlling the reaction temperature at which Carbon atoms are deposited on the substrate.

In order to confirm the growth of graphene on the Ti layer, $CH_4$:$H_2$ gas (50:50 sccm) was supplied as a reactive gas, and $CH_4$ gas was decomposed at a process temperature of 1000° C. at a heating rate of 5° C./min. To remove an oxide layer from the surface of Ti, 50 sccm of $H_2$ gas was supplied during the heating process. The deposition pressure was maintained at 200 mTorr, and deposition was carried out for 2 hours at each of 900, 800, 400 and 150° C. by controlling the position of the substrate.

Figure 6:
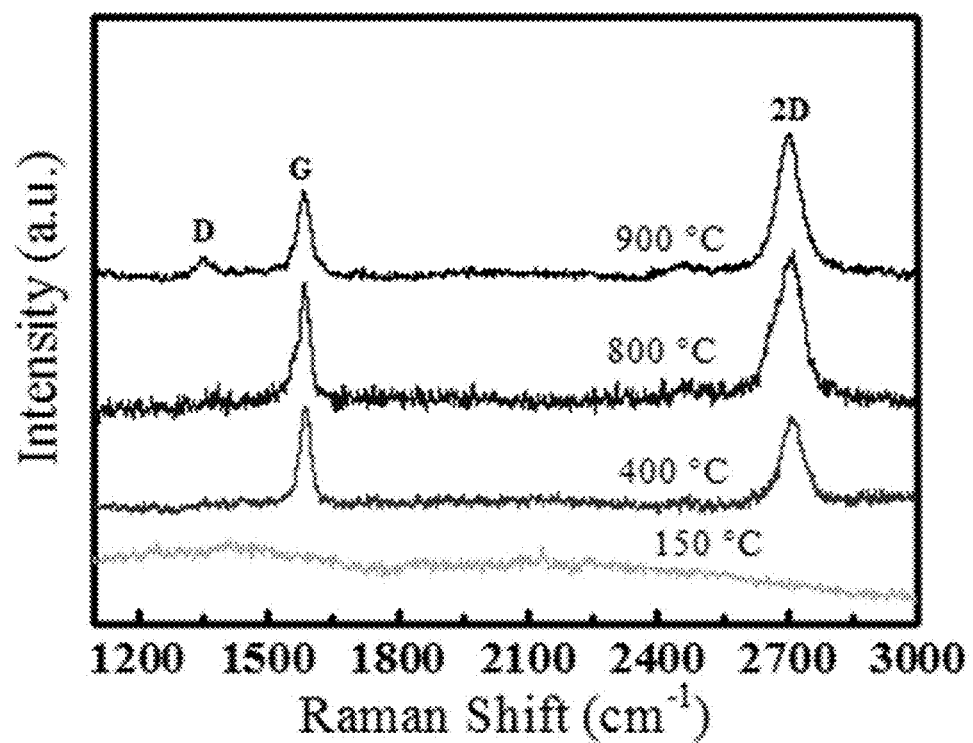
FIG. 6 is a Raman spectrum showing the characteristics of growth of graphene at varying temperatures according to an example of the present invention.

In order to confirm that graphene was grown on the substrate produced by the above-described method, the Raman spectrum was measured, and the results of the measurement are shown in FIG. 6. As shown in FIG. 6, not at a low temperature of 150° C., but at a temperature of 400° C. or higher, the G peak and the 2D peak appeared, indicating that graphene could grow on the Ti layer at high temperatures even in the absence of a catalytic nickel or copper metal. Particularly, graphene was produced even at 400° C., suggesting that graphene can grow at low temperatures. The sharp G peak appearing at about 1581 cm$^{-1}$ indicates that graphene grown on the Ti layer has excellent crystallinity, and the sharp 2D peak appearing at about 2704

$cm^{-1}$ without shift indicates that Carbon deposited on the Ti layer by the above-described method grew into graphene rather than graphite.

Example 3

Low-Temperature Growth of Graphene and Evaluation of Characteristics Thereof In order to grow graphene on a polymer substrate having low thermal stability, such as a flexible substrate, growth at low temperature is necessary. Thus, the growth characteristics of graphene under varying deposition conditions were evaluated, thereby confirming the possibility of growing graphene at low temperatures.

In order to grow graphene on a transparent flexible PET substrate, graphene was prepared on a Ti(10 nm)/PET substrate (fabricated according to the method described in Example 2-1) by T-CVD (thermal chemical vapor deposition) in the same manner as described in Example 2. $CH_4$ gas was decomposed at a process temperature of 1100° C. at a heating rate of 5° C./min, and 50 sccm of $H_2$ gas was supplied during the heating process to remove an oxide layer from the surface of Ti. During the reaction, a deposition temperature of 150° C. and a deposition pressure of 300 mTorr were maintained, and graphene was grown at a reactive gas composition and flow rate of $CH_4:H_2=60:150$, 100:200 or 200:100 sccm.

Figure 7:
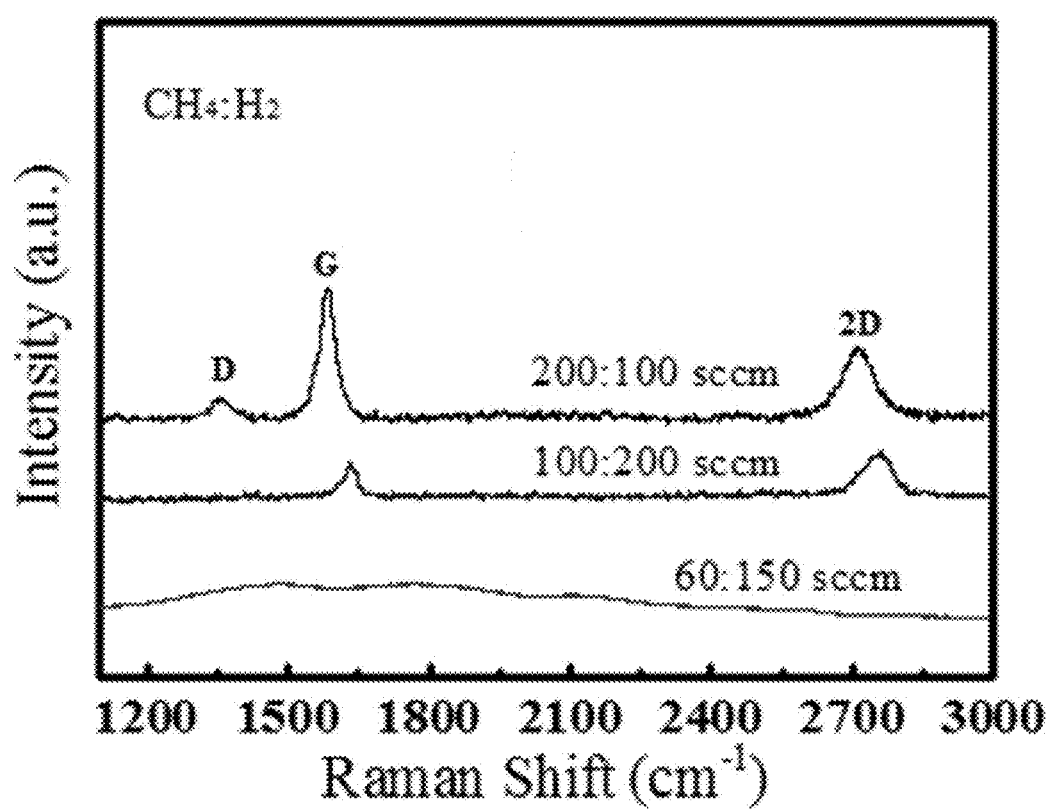
FIG. 7 is a Raman spectrum showing the characteristics of growth of graphene under varying deposition conditions according to an example of the present invention.

FIG. 7 is the Raman spectrum of C deposited on the Ti layer by the above-described method. From FIG. 7, it can be seen that no graphene was produced under the conditions of growth temperature of 150° C. and flow rate of $CH_4:H_2=60:150$ sccm. However, as the ratio and flow rate of $CH_4$ increased, formation of the G and 2D peaks was observed under a condition of $CH_4:H_2=100:200$ sccm, even though the shift of the peaks appeared. Thus, under this condition, graphene was grown on the substrate, even though the crystallinity or quality of the graphene decreased. Graphene grown under a condition of $CH_4:H_2=200:100$ sccm (with an increased $CH_4$ ratio and flow rate) showed a sharp G peak at ~1582 $cm^{-1}$, indicating that the graphene has excellent crystallinity. In addition, the 2D peak appearing at ~2704 $cm^{-1}$ without shift indicates that Carbon thermally decomposed by the above-described method was grown into graphene rather than graphite on the Ti layer of the PET polymer substrate at low temperature.

Thus, in order to enable a graphene layer having excellent crystallinity even at low temperature, the effect of each deposition condition on the growth of graphene was examined.

1) Evaluation of Growth Characteristics of Graphene at Varying Working Pressures Using the Ti(10 nm)/$SiO_2$/Si substrate fabricated according to the method described in Example 2-1), graphene was grown by the same method as described in Example 2-2). $CH_4$ gas was decomposed at a process temperature of 1100° C. at a heating rate of 5° C./min, and 10 sccm of $H_2$ gas was supplied at 750° C. for 240 minutes during the heating process to remove an oxide layer from the surface of Ti. During the reaction, the deposition temperature was maintained at 150° C., and graphene was deposited for 2 hours while a reactive gas was supplied at a composition and flow rate of $CH_4:H_2=1:10$ sccm. Graphene was grown at a working pressure of each of 5, 10 and 50 mTorr.

Figure 8:
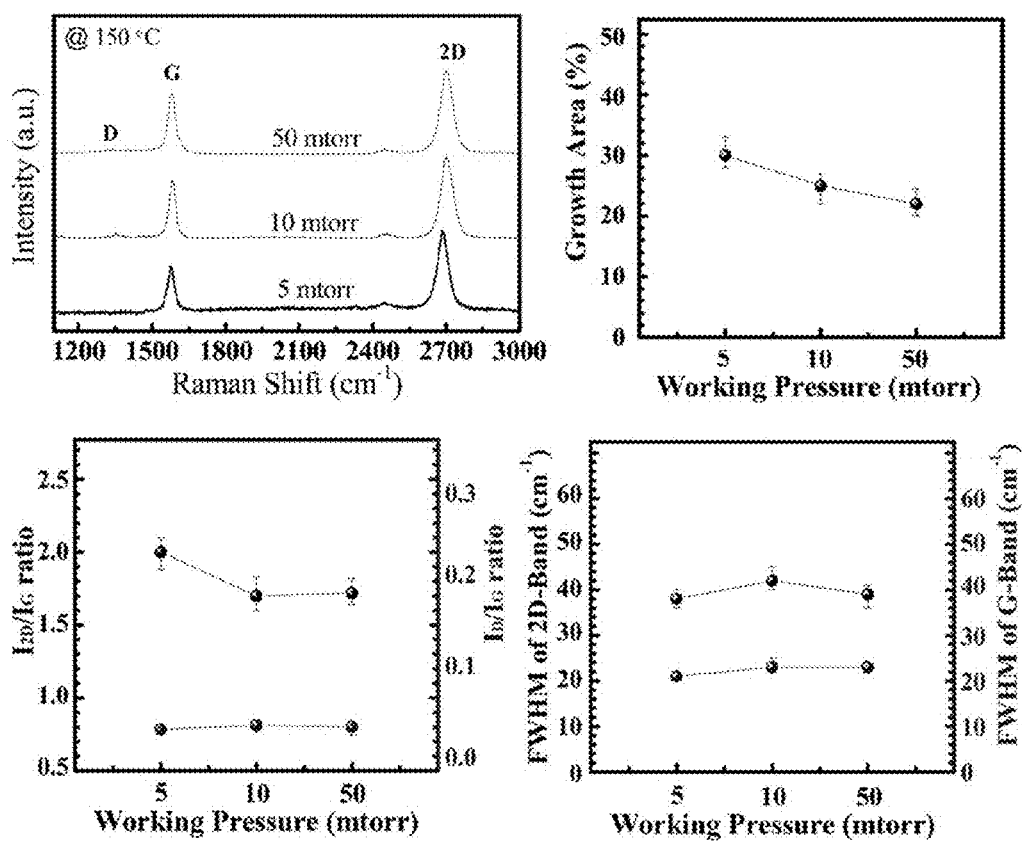
FIG. 8 depicts a Raman spectrum and graphs showing the characteristics of growth of graphene as a function of working pressures.

FIG. 8 depicts the Raman spectrum of the graphene layer formed by the above-described method, and also depicts graphs showing the growth area of graphene and peak characteristics observed on the Raman spectrum. From FIG. 8, it can be seen that, as the working pressure decreases, the growth area of graphene increases, and a graphene layer having better crystallinity is obtained.

2) Evaluation of Growth Characteristics as a Function of Pretreatment Time of Ti Layer Graphene was grown in the same manner as described in 1) above, except that the time of treatment with $H_2$ gas for removing an oxide layer from the surface of Ti was controlled to each of 60, 120, 180 and 240 minutes at 750° C. The working pressure was maintained at 5 mTorr.

Figure 9:
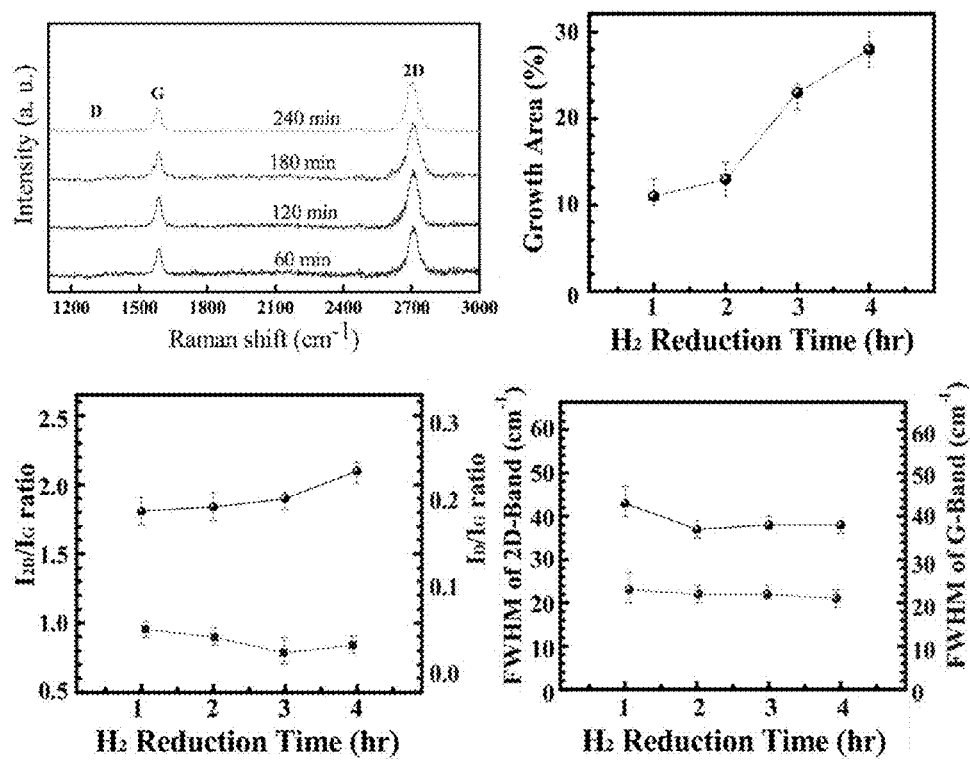
FIG. 9 depicts a Raman spectrum and graphs showing the characteristics of growth of graphene as a function of hydrogen reduction time.

FIG. 9 depicts the Raman spectra of the graphene layers formed using varying hydrogen reduction times, and also depicts graphs showing the growth area of graphene and peak characteristics observed on the Raman spectrum. From FIG. 9, it can be seen that, as the hydrogen reduction time increases, the growth area of graphene greatly increases, and as the hydrogen reduction time decreases, the signal of the Raman spectrum becomes weaker, but as the hydrogen reduction time increases, the intensity of the signal increases, a clear spectrum can be obtained, suggesting that the crystallinity of graphene increases.

3) Evaluation of Growth Characteristics of Graphene as a Function of Composition of Reactive Gas (1) Evaluation of Growth Characteristics of Graphene with Increase in Content of Hydrogen in Reactive Gas Graphene was grown in the same manner as described in 1) above, except that the composition and flow rate of the reactive gas were controlled to $CH_4:H_2=1:10$, 1:20, 1:30 and 1:40 sccm. The working pressure was maintained at 10 mTorr.

Figure 10:
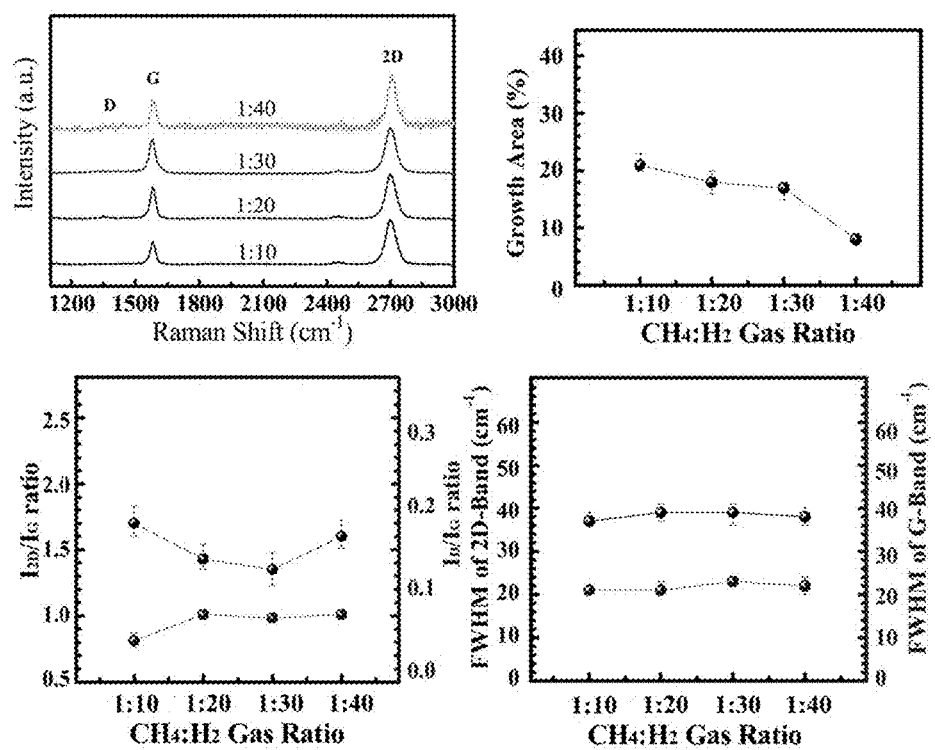
FIG. 10 depicts a Raman spectrum and graphs showing the characteristics of growth of graphene as a function of the content of hydrogen gas in a reactive gas.

FIG. 10 depicts a Raman spectrum showing the characteristics of graphene formed while increasing the content of hydrogen in the reactive gas, and also depicts graphs showing the growth area of graph and peak characteristics observed on the Raman spectrum. As can be seen in FIG. 10, when only the content of hydrogen increased while the content of the carbon source $CH_4$ was fixed, the growth rate of graphene gradually decreased, and the growth area of graphene decreased rapidly at $CH_4:H_2=1:40$ sccm. In addition, it could be seen that the Raman signal of the produced graphene decreased as the content of hydrogen increased, and graphene formed under a condition of $CH_4:H_2=1:40$ sccm showed a weak signal on the Raman spectrum.

(2) Evaluation of Growth Characteristics of Graphene with Increase in Content of Carbon Source in Reactive Gas Graphene was grown in the same manner as described in 1) above, except that the composition and flow rate of the reactive gas were controlled to $CH_4:H_2=1:10$, 3:10, 5:10 and 10:10 sccm. The working pressure was maintained at 10 mTorr.

Figure 11:
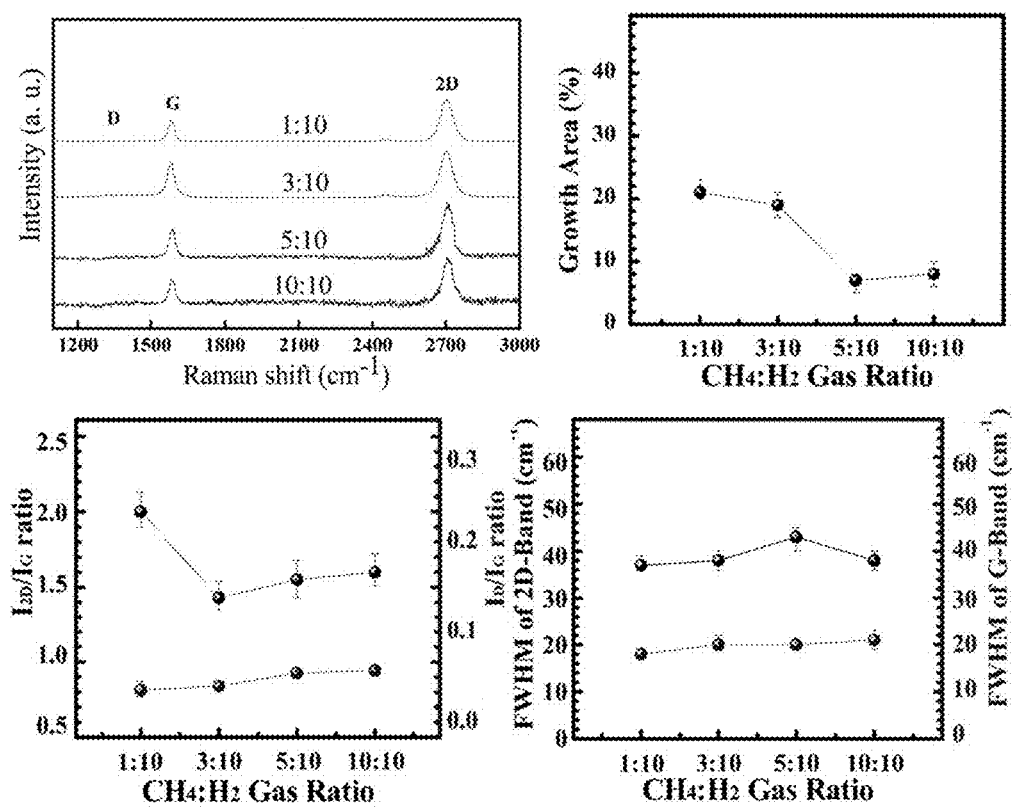
FIG. 11 depicts a Raman spectrum and graphs showing the characteristics of growth of graphene as a function of the content of methane gas in a reactive gas.

FIG. 11 depicts a Raman spectrum showing the characteristics of graphene formed while increasing the content of the carbon source methane gas in the reactive gas, and also depicts graphs showing the growth area of graph and peak characteristics observed on the Raman spectrum. From FIG. 11, it could be seen that, as the content of $CH_4$ increased, the growth area of graphene greatly decreased, and the Raman characteristics of the formed graphene also decreased rapidly.

As described above, according to the graphene layer formation method of the present invention, graphene can be formed directly on a base substrate by modifying the surface of the base substrate with a Ti layer without changing the transparency and electrical properties of the base substrate, indicating that a separate transfer process is not required, thereby minimizing mechanical defects of graphene. Thus, the method of the present invention can be used to fabricate an electrical device comprising a good-quality graphene layer.

In addition, according to the present invention, graphene can be grown on a substrate even at a low substrate temperature of 400° C. or lower, particularly 150° C., and thus a graphene layer can be formed directly on a flexible substrate made of a polymer such as PET, which serves as a base substrate. Furthermore, during the growth of graphene, the graphene forms a strong bond with the substrate by the bonding between oxygen from the graphene and the Ti layer and the bonding between the Ti layer and oxygen from the substrate, and thus has excellent durability. Therefore, the graphene layer formed according to the present invention can be more advantageously used in flexible electrical devices that have recently attracted attention.

What is claimed is:

1. A method for manufacturing an electrical device, the method comprising the steps of:
   (A) modifying a surface of a base substrate by sputtering titanium (Ti) on the surface to form a Ti layer on the surface, wherein the Ti layer has a thickness of 3-20 nm; and
   (B) growing a graphene layer, by chemical vapor deposition, on the Ti layer formed on the surface, wherein the electrical device comprises the base substrate, the Ti layer, and the graphene layer.

2. The method of claim 1, wherein the base substrate is made of a material comprising glass, $SiO_2$, a synthetic polymer containing an oxygen atom, or any combination thereof.

3. The method of claim 1, wherein the step (B) comprises growing graphene by chemical vapor deposition under a condition in which a temperature of the substrate is 150° C. to 900° C.

4. The method of claim 3, wherein the step (B) comprises growing graphene by chemical vapor deposition under a condition in which a temperature of the substrate is 150° C. to 400° C.

5. The method of claim 4, wherein a working pressure in the step (B) is 10 mTorr or lower.

6. The method of claim 1, further comprising, before growing the graphene layer, treating the Ti layer with hydrogen gas.

7. The method of claim 1, wherein a reactive gas which is used in the chemical vapor deposition comprises a mixture of hydrogen gas and one or more carbon sources selected from the group consisting of methane, ethane, propane, acetylene, methanol, ethanol and propanol.

* * * * *